(12) United States Patent
Takagi et al.

(10) Patent No.: US 7,681,155 B2
(45) Date of Patent: Mar. 16, 2010

(54) METHOD OF DESIGNING AND MANUFACTURING SEMICONDUCTOR DEVICE

(75) Inventors: Shigeyuki Takagi, Kanagawa-ken (JP); Shigeru Kinoshita, Kanagawa-ken (JP); Hiroshi Watanabe, Kanagawa-ken (JP); Toshitake Yaegashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 11/858,551

(22) Filed: Sep. 20, 2007

(65) Prior Publication Data

US 2008/0256496 A1    Oct. 16, 2008

(30) Foreign Application Priority Data

Mar. 28, 2007   (JP) ............................. 2007-084989

(51) Int. Cl.
*G06F 17/50*   (2006.01)
(52) U.S. Cl. .............................................. 716/4; 716/5
(58) Field of Classification Search .................. 716/4–6
See application file for complete search history.

(56) References Cited

U.S. PATENT DOCUMENTS

| 6,643,831 | B2 * | 11/2003 | Chang et al. | .................... | 716/4 |
| 6,959,427 | B2 * | 10/2005 | Kimura | ........................ | 716/4 |
| 2002/0104063 | A1 * | 8/2002 | Chang et al. | .................... | 716/4 |

FOREIGN PATENT DOCUMENTS

| JP | 2001-028405 | 1/2001 |
| JP | 2006-196114 | 7/2006 |

* cited by examiner

*Primary Examiner*—Jack Chiang
*Assistant Examiner*—Binh C Tat
(74) *Attorney, Agent, or Firm*—Pearne & Gordon LLP

(57) ABSTRACT

A semiconductor device designing method includes calculating capacitance. The semiconductor device has a semiconductor substrate, an insulator formed on the semiconductor substrate, and an electrode formed on the insulator. The capacitance is calculated under an approximation assuming a portion of the semiconductor substrate, the insulator and a portion of the electrode to be one of a conductor and a dielectric depending on electric characteristics thereof, respectively.

15 Claims, 6 Drawing Sheets

METHOD OF DESIGNING AND MANUFACTURING SEMICONDUCTOR DEVICE

CROSS-REFERENCE TO RELATED APPLICATIONS

This application is based upon and claims the benefit of priority from the prior Japanese Patent Application No. 2007-084989, filed on Mar. 28, 2007; the entire contents of which are incorporated herein by reference.

BACKGROUND OF THE INVENTION

1. Field of the Invention

The present invention relates to a method of designing semiconductor devices and a method of manufacturing semiconductor devices using the designing method, and particularly to a method of designing semiconductor devices taking account of parasitic capacitance and a method of manufacturing semiconductor devices using the designing method.

2. Background Art

A memory cell of a nonvolatile semiconductor device has a floating gate formed on a semiconductor substrate through a gate insulating film, and a control gate formed on the floating gate through an insulating film. The both gates are electrostatically coupled with each other, and when a voltage is applied to the control gate, the voltage is applied to the floating gate through the insulating film. An electric field generated between the floating gate and the silicon substrate (Si) in response to the voltage applied to the floating gate brings about a tunnel effect in the gate insulating film, causing an injection or emission of electrons into or from the floating gate. In this way, a nonvolatile semiconductor device enables writing and deleting operations by injecting or emitting electrons into or from the floating gate.

Therefore, in designing the structure of a memory cell, it is necessary to accurately estimate the effect of the electrical potential from adjacent cells, and to keep it below a certain level. For example, Japanese patent laid-open publication JP-A 2006-196114(Kokai) discloses a method providing a reference transistor to calculate the coupling ratio of gate capacitances, and then to set the control gate voltage by accurately evaluating the coupling ratio.

Various simulations have been also applied. For example, Japanese patent laid-open publication JP-A 2001-28405(Kokai) discloses a method to combine process simulation and device simulation to execute more accurate capacitance simulation.

However, since process simulation and device simulation takes enormous amount of time, it is difficult to feedback the design values to the products without delay.

SUMMARY OF THE INVENTION

According to an aspect of the invention, there is provided a semiconductor device designing method, the semiconductor device having a semiconductor substrate, an insulator formed on the semiconductor substrate, and an electrode formed on the insulator, the method including: calculating capacitance under an approximation assuming a portion of the semiconductor substrate, the insulator and a portion of the electrode to be one of a conductor and a dielectric depending on electric characteristics thereof, respectively.

According to another aspect of the invention, there is provided a semiconductor device designing method, the semiconductor device having a plurality of memory cells arranged in X-Y direction on a semiconductor substrate, each of the memory cells having a first gate electrode formed on a first insulator provided on the semiconductor substrate and a second gate electrode formed on a second insulator provided on the first gate electrode, the method including: calculating capacitance under an approximation assuming a portion of the semiconductor substrate, at least one of the first and the second insulators and a portion of the second gate electrode to be one of a conductor and a dielectric depending on electric characteristics thereof, respectively.

According to another aspect of the invention, there is provided a semiconductor device manufacturing method, the semiconductor device having a semiconductor substrate, an insulator formed on the semiconductor substrate, and an electrode formed on the insulator, the method including: adjusting sizes of the insulator and the electrode so that a capacitance calculated under an approximation assuming a portion of the semiconductor substrate, the insulator and a portion of the electrode to be one of a conductor and a dielectric depending on electric characteristics thereof, respectively, is optimized.

DETAILED DESCRIPTION OF THE INVENTION

Embodiments of the invention will be explained in detail hereinafter, with reference to the drawings.

Figure 1:
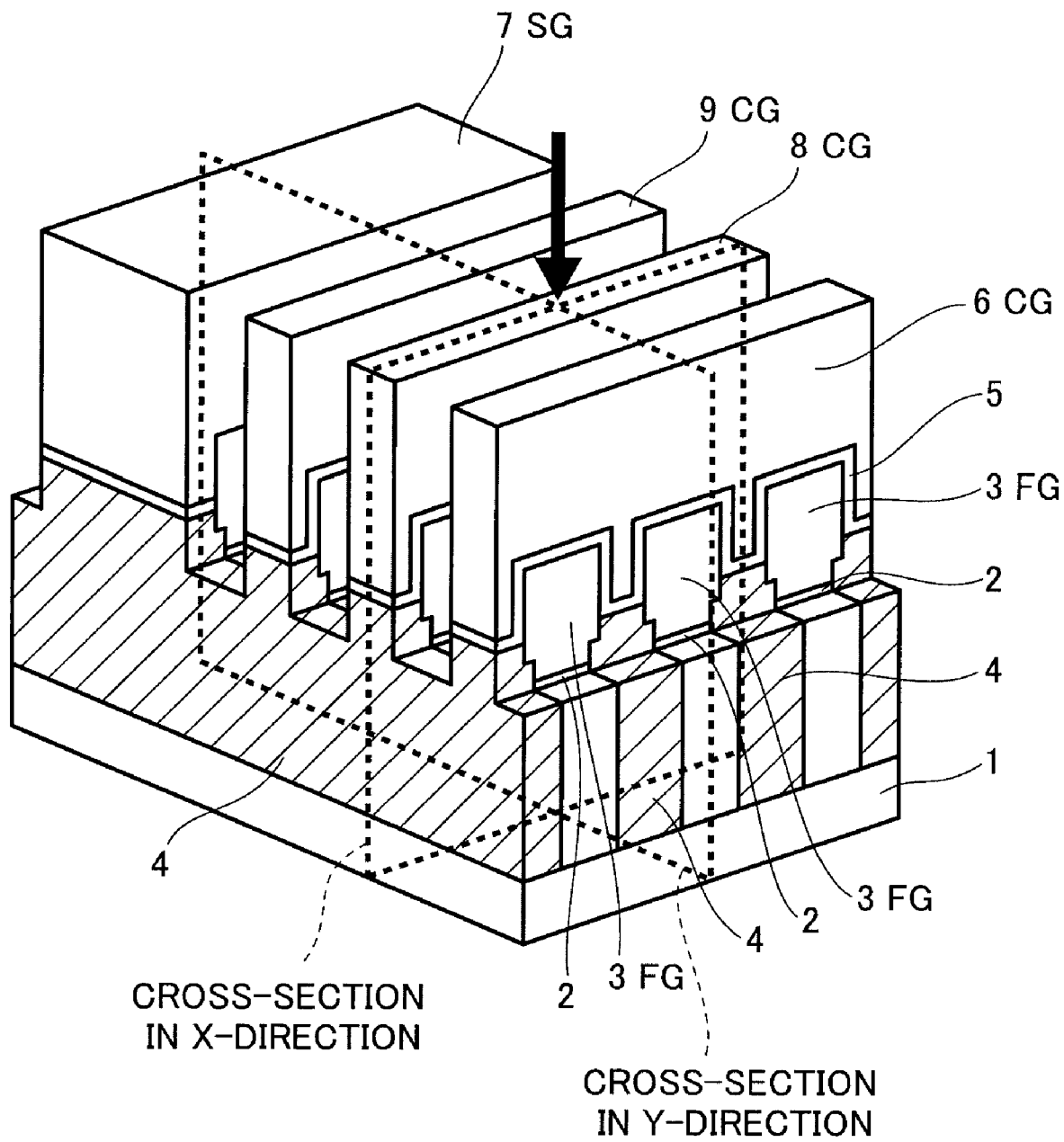
FIG. 1 is a partial schematic diagram showing a NAND type flash memory.

FIG. 1 is a partial schematic diagram of a NAND type flash memory. Floating gates 3 are formed on a silicon substrate 1 through a gate insulating film 2. STI (Shallow Trench Isolation) 4 is formed on the silicon substrate 1 to isolate each element. Control gates 6, 8 and 9 are formed on the floating gates 3 and STI 4 through an insulating film 5. Each memory cell is comprised of a floating gate 3 and a control gate 6, so that the section of the memory sell array shown in FIG. 1 has 9 memory cells. In the actual device, 16 memory cells, for example, are continuously formed between two select gates 7 in Y-direction, and 16 memory cells, for example, are also continuously formed in X-direction. For example, the memory cell arranged at the intersection of X-Y and X-Z cross-sectional surfaces, indicated by the arrow in FIG. 1, is surrounded by 8 memory cells.

Figure 2A:
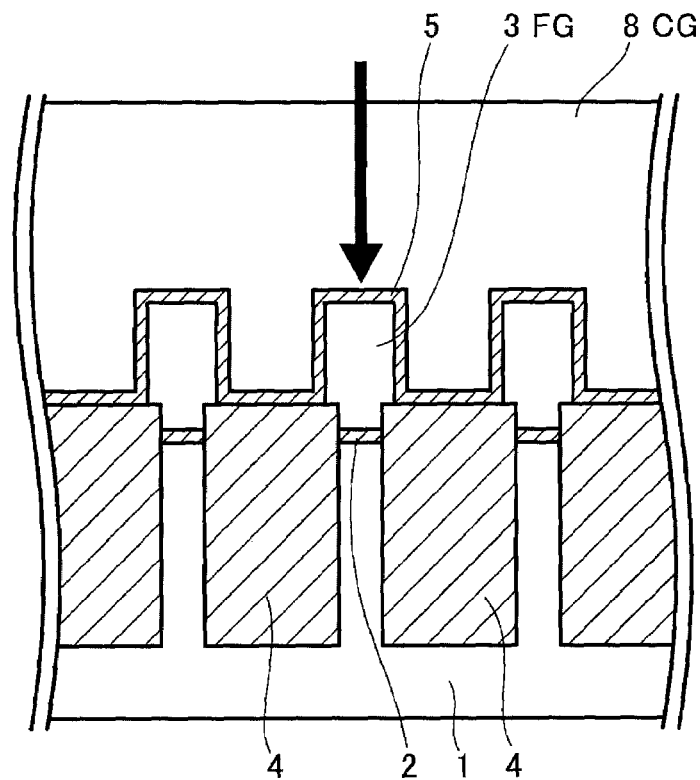
FIGS. 2A and 2B are schematic cross-section diagrams showing the flash memory of FIG. 1 viewed from X-direction and from Y-direction, respectively.
Figure 2B:
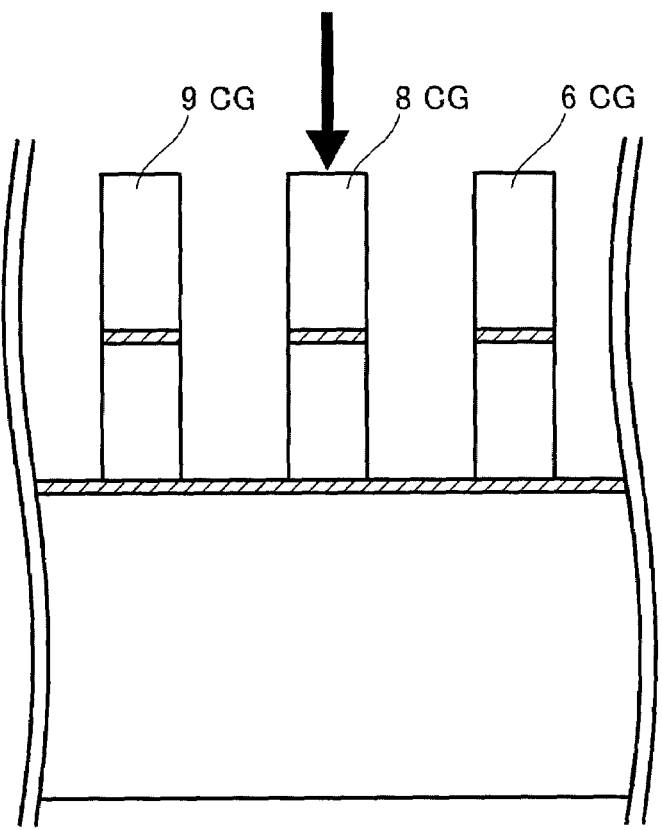

FIG. 2A is a schematic cross-section diagram of the flash memory of FIG. 1 viewed in X-direction, and FIG. 2B is a schematic cross-section diagram viewed in Y-direction.

The memory cells have the common control gate 8 in X-direction, and are equally spaced apart from each other in Y-direction. When writing operation is executed at one of the cells, a high voltage is applied to the control gate 8 of the one of the cells, and a medium voltage is applied to the adjacent control gates 5 and 9 to bring their respective memory cell transistors into conduction. The one of the cells will be affected by these adjacent cells when electrons are injected into the floating gate to perform the writing operation.

Figure 3A:
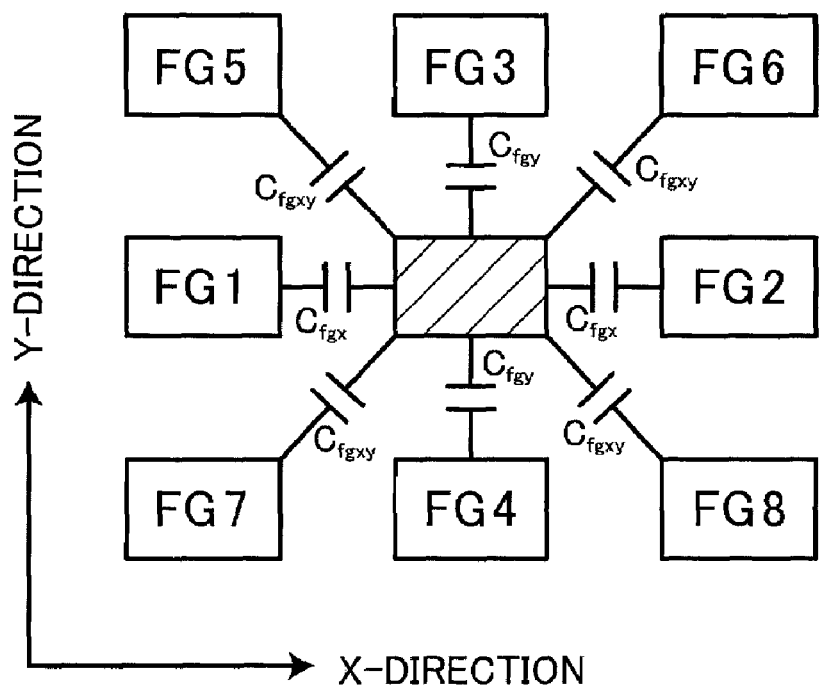
FIGS. 3A and 3B are schematic diagrams showing the capacitive relations between the floating gate of one of the cells and those of surrounding cells, and between the control gate and silicon substrate of the one of the cells, respectively.
Figure 3B:
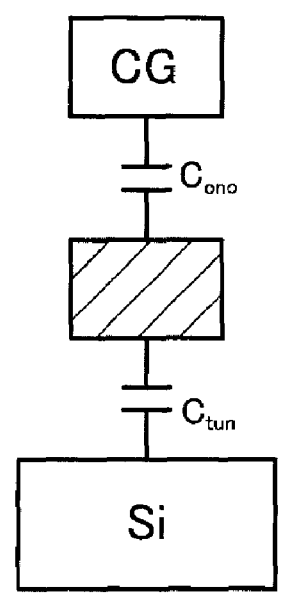

FIG. 3A is a schematic diagram showing the capacitive relations between the floating gate of one of the cells and those of surrounding cells, and FIG. 3B is a schematic diagram showing the capacitive relation between the control gate and silicon substrate of the one of the cells.

As shown in FIG. 3A, a capacitance $C_{fgx}$ is formed between the floating gate of the one of the cells (shown as a hatched box) and the floating gates FG1 and FG2 adjacent in X-direction, a capacitance $C_{fgy}$ is formed between the floating gate of the one of the cells and the floating gates FG3 and FG4 adjacent in Y-direction, and a capacitance $C_{fgxy}$ is formed between the floating gate of the one of the cells and the floating gates FG5, FG6, FG7, and FG5 adjacent in diagonal directions.

In addition, as shown in FIG. 3B, a capacitance $C_{tun}$ is formed between the floating gate (FG) of the one of the cells and the silicon substrate Si, and a capacitance $C_{ono}$ is formed between the floating gate and the control gate CG.

The coupling ratio of the one of the memory cells is given by the following equation using the afore-mentioned capacitances between adjacent cells.

$$\text{Coupling ratio} = \frac{C_{ono}}{C_{tun} + C_{ono} + 2C_{fgx} + 2C_{fgy} + 4C_{fgxy}}$$

Further, the inter-cell interference effect $\Delta V_{fg}$ between the one of the cells and adjoining cells can be calculated by the following equation using the afore-mentioned capacitances.

$$\Delta V_{fg} = \frac{(\Delta V1 + \Delta V2)C_{fgx} + \Delta V4 C_{fgy} + (\Delta V3 + \Delta V5)C_{fgxy}}{C_{tun} + C_{ono} + 2C_{fgx} + 2C_{fgy} + 4C_{fgxy}}$$

When designing a memory cell, it is necessary to accurately estimate the inter-cell interference effect $\Delta V_{fg}$ obtained in this manner, and to keep the effect below a certain level. Therefore, it is important to simulate capacitances between the one of the cells and adjacent cells.

As a way for calculating capacitances, a method using Poisson equation is adopted.

Since elements must be classified into conductors and dielectrics in Poisson equation, a semiconductor device is assumed to be a conductor or a dielectric depending on its electric characteristics. For example, semiconductor elements such as a silicon substrate and control gate may be dealt as conductors, and insulator such as gate oxide films and STI may be dealt as a dielectric.

In this way, it is possible to estimate capacitances within 10% error from the actual measurement for a NAND type flash memory having a design rule lower than 100 nm by calculating the capacitances formed between by the capacitance simulator using Poisson equation.

Usually, similar kind of simulations have been often executed by a device simulation. The device simulation takes large amount of time. Since the simulation in accordance with an embodiment of the invention uses capacitance simulation, the result can be obtained in shorter time. Therefore, the simulation can be flexibly applied to change of design values in response to the simulation result.

Next, a method for calculating capacitances capable of dealing with flash memories with rapidly advancing finer design rule is explained hereinafter.

In the embodiment previously explained, the capacitance is calculated by the capacitance simulator under an approximation assuming that the whole silicon substrate is a conductor. In this embodiment, an approximation for the depletion layer of a semiconductor device is taken into account.

When a voltage is applied in a semiconductor, carriers move out of the interface area with the insulator, and it forms a depletion layer in which no or little carriers exist. Since the depletion layer has no carriers, it acts like a dielectric. Therefore, additional conditions that the depletion area is approximated as a dielectric and the remaining area of the silicon substrate approximated as a conductor are included to the previous embodiment.

Figure 4:
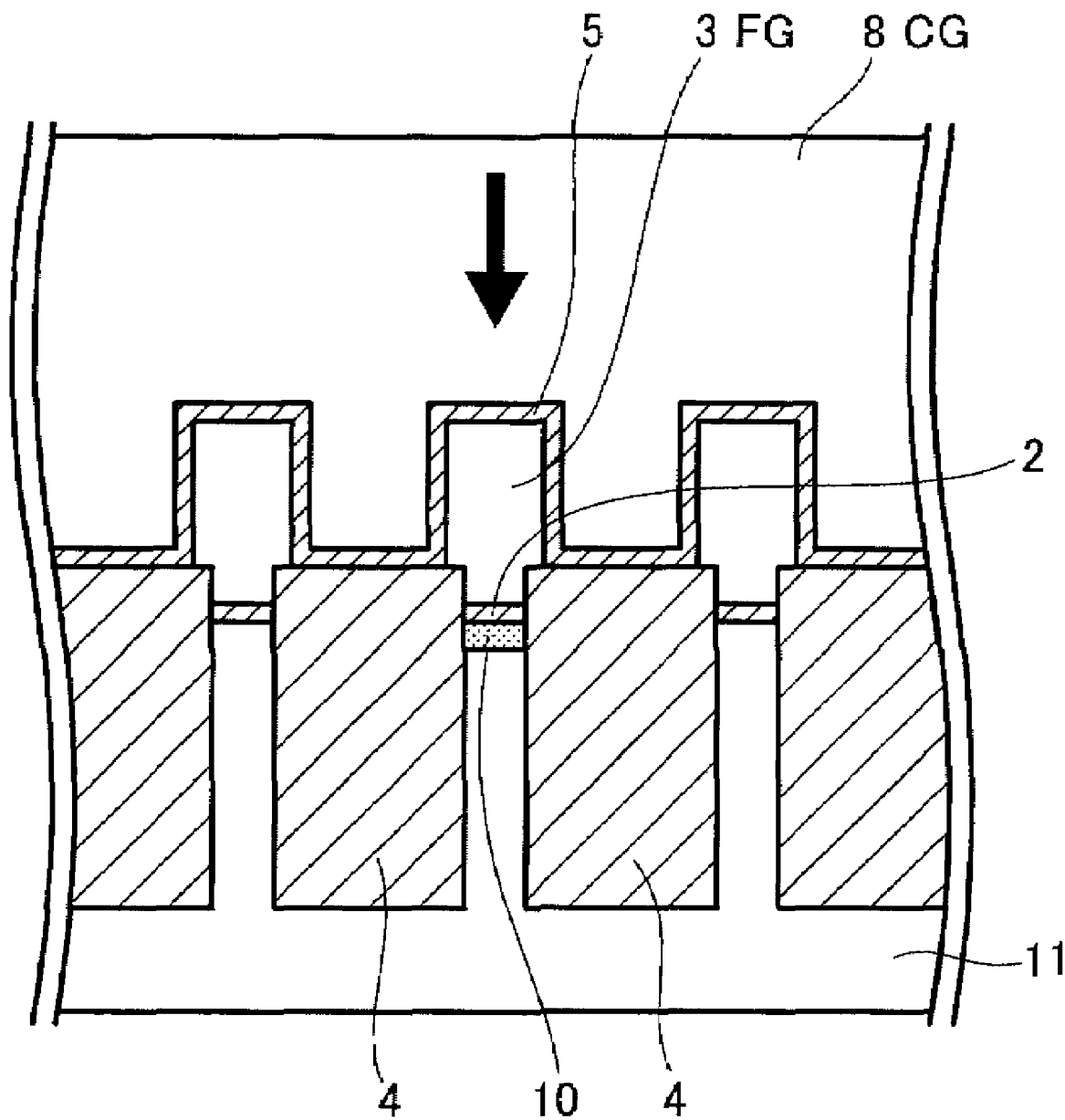
FIG. 4 is a schematic diagram showing an embodiment of the invention in which a dielectric approximation is applied to a part of a silicon substrate.

FIG. 4 is a schematic diagram showing an embodiment in which a dielectric approximation is applied to a part of a silicon substrate. FIG. 4 illustrates a case in which reading operation is executed at one of the cells indicated by an arrow. For example, it is assumed here that after "1" was written in the one of the cells, "2" is written in an adjacent cell. Then, after "2" was written in the adjacent cell, the threshold of the one of the cells in which "1" was written shifts due to the effect of the electric field from the adjacent cell in which "2" was written. The embodiment of the invention takes account of such inter-cell interference effect.

That is, the threshold of the cell in which "1" was written shifts due to the effect by the cell in which "2" was written. The way of the electric field propagation from the cell in which "2" was written varies depending on whether the substrate of the cell in which "2" was written has a depletion layer portion or not. The embodiment of the invention takes account of this effect and a depletion approximation is executed. In reading operation, the voltage of the control gate 8 is increased from minus 3 volts to plus 3 volts. In the case that the writing state in the one of the cells corresponds to plus 0.5 volts, when the voltage of the control gate 8 is 0.5 volts, the channel is opened and an electric current flows through it, and the writing state of plus 0.5 volts is identified.

At the same time, a similar operation is executed in cells neighboring through STI 4 (cells adjacent in X-direction). That is, if the writing state of the adjacent cells is minus 3 volts, an immediate inversion occurs at the initial stage of the voltage application to the control gate 8 (from minus 3 volts to plus 3 volts), therefore, the Si substrate of the adjacent cells is assumed to be a conductor.

On the other hand, if the writing state of the adjacent cells is plus 3 volts, the depletion layer portion remains throughout the reading operation in the one of the cells (inversion occurs at plus 0.5 volts). Thus, the depletion portion of Si substrate is assumed to be a dielectric in the dielectric approximation model.

Figure 5A:
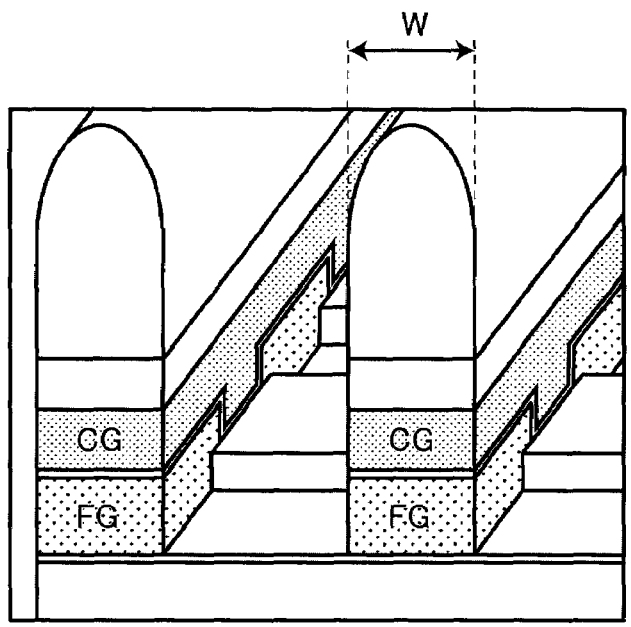
FIG. 5A is a perspective cross-section diagram for explaining a gate width and FIG. 5B is a graph showing change in the threshold $V_{th}$ by inter-cell interference effect.

FIG. 5A is a perspective cross-section diagram for explaining a gate width (W).

Figure 5B:
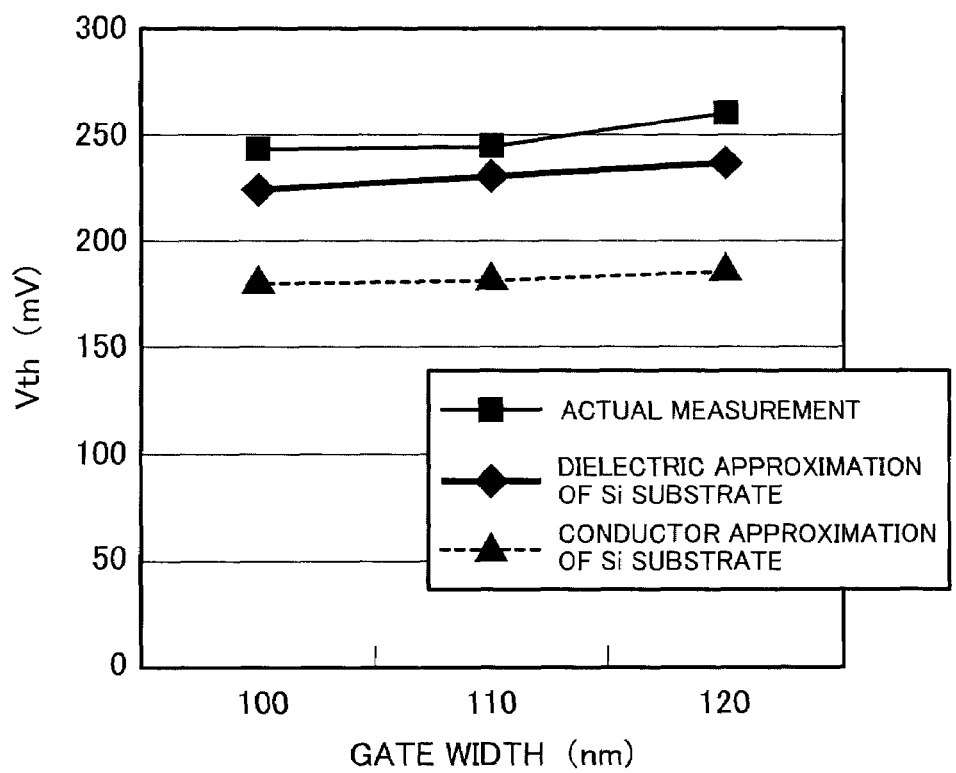

FIG. 5B shows change in the threshold $V_{th}$ by the parasitic capacitance between adjoining cell, using the width of the floating gate and the control gate defined as a gate width (W) viewed from the Y-direction cross-section in FIG. 1, as shown in FIG. 5A. A value of 11.4, which is an actually measured value for a relative dielectric constant of silicon, was used as the dielectric constant in the simulation.

As shown in FIG. 5B, it can be seen that a result where an error is within 7% is obtained by the embodiment in which the silicon substrate except for the channel region of the one of the cells is assumed to be a dielectric (dielectric approximation), and the result is extremely close to the actually measured value in comparison with a result in which the whole substrate is assumed to be a conductor (conductor approximation).

As the design rule of memory cells will become finer than 100 nm in the future, an embodiment according to the invention allows simulating inter-cell interference effect more accurately.

Next, an embodiment in which a depletion layer formed at the control gates is assumed to be a dielectric is explained hereinafter.

Figure 6:
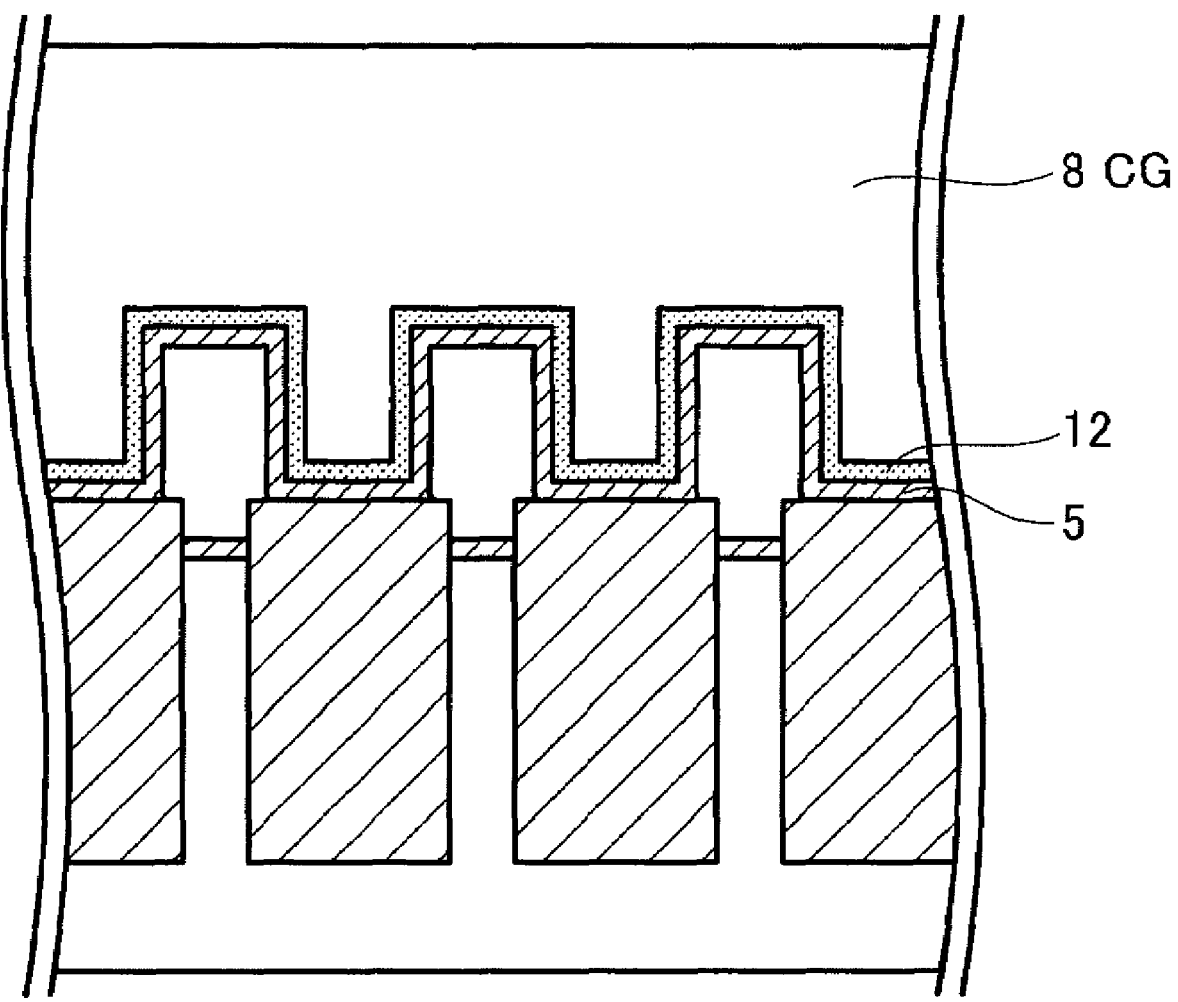
FIG. 6 is a schematic diagram showing an embodiment of the invention in which a dielectric approximation is applied to control gates.

FIG. 6 is a schematic diagram showing an embodiment in which a dielectric approximation is applied to the control gates. A polysilicon, which is doped with phosphorus (P), is used for control gates to improve conductivity, and the control gates have a depletion area when a voltage is applied. The depth of the depletion layer is several nanometers, and it acts as a dielectric. Therefore, the simulation can be carried out providing a dielectric layer 12 having a thickness corresponding to the thickness of the depletion layer in the interface area with the insulating film 5 as shown in FIG. 6.

By adding the features of this embodiment in the previous embodiment, more accurate simulation results can be obtained and it leads to an accurately estimation of inter-cell interference effect of a flash memory. It shortens the time needed for the simulations, which have been conducted by device simulations or process simulations with enormous amount of simulation time in prior art.

Embodiments of the invention have been explained with the reference to the drawings. However, the invention is not limited to those embodiments. For example, the invention is also applicable to NOR type flash memories in addition to NAND type flash memories.

The invention claimed is:

1. A semiconductor device designing method, the semiconductor device having a plurality of memory cells arranged in X-Y direction on a semiconductor substrate, each of the memory cells having a first gate electrode formed on a first insulator provided on the semiconductor substrate and a second gate electrode formed on a second insulator provided on the first gate electrode, the method comprising:

calculating capacitance under an approximation assuming a portion of the semiconductor substrate, at least one of the first and the second insulators and a portion of the second gate electrode to be one of a conductor and a dielectric depending on electric characteristics thereof, respectively, wherein the calculating capacitance includes calculating a capacitance between one of the memory cells and an adjacent memory cell under an approximation assuming an inversion layer portion formed in the semiconductor substrate under the adjacent memory cell to be a conductor and assuming a depletion layer portion formed in the semiconductor substrate under the adjacent memory cell to be a dielectric, a capacitance $C_{fgx}$ between the first gate electrode of one of the memory cells and an adjacent first gate electrode in X-direction, a capacitance $C_{fgy}$ between the first gate electrode of the one of the memory cells and an adjacent first electrode in Y-direction, a capacitance $C_{fgxy}$ between the first gate electrode of the one of the memory cells and an adjacent first gate electrode in a diagonal direction, a capacitance $C_{tun}$ between the first gate electrode of the one of the memory cells and the semiconductor substrate of the one of the memory cells, and a capacitance $C_{ono}$ between the first gate electrode of the one of the memory cells and the second gate electrode of the one of the memory cells.

2. The semiconductor device designing method according to claim 1, the calculating capacitance further including calculating a coupling ratio of the one of the memory cells given by following equation:

$$\text{Coupling ratio} = \frac{C_{ono}}{C_{tun} + C_{ono} + 2C_{fgx} + 2C_{fgy} + 4C_{fgxy}}.$$

3. The semiconductor device designing method according to claim 1, the calculating capacitance further including calculating an inter-cell interference effect by using the capacitance $C_{fgx}$, the capacitance $C_{fgy}$, the capacitance $C_{fgxy}$, the capacitance $C_{tun}$ and the capacitance $C_{ono}$.

4. The semiconductor device designing method according to claim 1, wherein the calculating capacitance is carried out by using a Poisson equation.

5. The semiconductor device designing method according to claim 1, wherein the calculating capacitance is carried out under an approximation assuming the semiconductor substrate and the second gate electrode to be a conductor and assuming the first and the second insulators and a device isolation layer of the semiconductor device to be a dielectric.

6. The semiconductor device designing method according to claim 1, wherein the calculating capacitance is carried out under an approximation assuming a depletion layer portion of the semiconductor substrate to be a dielectric and a remaining portion of the semiconductor substrate to be a conductor.

7. The semiconductor device designing method according to claim 1, wherein the calculating capacitance is carried out under an approximation assuming a depletion layer portion formed in the second electrode to be a dielectric.

8. The semiconductor device designing method according to claim 1, wherein the calculating capacitance includes calculating a capacitance between one of the memory cells and an adjacent memory cell under an approximation assuming a depletion layer portion formed in one of the first electrode and the second electrode of the one of the memory cells to be a dielectric.

9. The semiconductor device designing method according to claim 1, wherein the calculating capacitance includes calculating a capacitance between one of the memory cells and an adjacent memory cell under an approximation assuming a depletion layer portion formed in one of the first electrode and the second electrode of the one of the memory cells to be a dielectric.

10. The semiconductor device designing method according to claim 1, wherein the semiconductor device is a NAND type flash memory.

11. The semiconductor device designing method according to claim 1, wherein the semiconductor device is a NOR type flash memory.

12. A semiconductor device manufacturing method, the semiconductor device having a semiconductor substrate, an insulator formed on the semiconductor substrate, and an electrode formed on the insulator, the method comprising:

adjusting sizes of the insulator and the electrode so that a capacitance calculated using a microprocessor under an approximation assuming a portion of the semiconductor substrate, the insulator and a portion of the electrode to be one of a conductor and a dielectric depending on electric characteristics thereof, respectively, is optimized, wherein the capacitance is calculated by calculating, a capacitance between one of the memory cells and an adjacent memory cell under an approximation assuming an inversion layer portion formed in the semiconductor substrate under the adjacent memory cell to be a conductor and assuming a depletion layer portion formed in the semiconductor substrate under the adjacent memory cell to be a dielectric, a capacitance $C_{fgx}$ between the first gate electrode of one of the memory cells and an adjacent first gate electrode in X-direction, a capacitance $C_{fgy}$ between the first gate electrode of the one of the memory cells and an adjacent first electrode in Y-direction, a capacitance $C_{fgxy}$ between the first gate electrode of the one of the memory cells and an adjacent first gate electrode in a diagonal direction, a capacitance $C_{tun}$ between the first gate electrode of the one of the memory cells and the semiconductor substrate of the one of the memory cells, and a capacitance $C_{ono}$ between the first gate electrode of the one of the memory cells and the second gate electrode of the one of the memory cells.

13. The semiconductor device designing method according to claim 12, wherein the semiconductor device has a plurality of memory cells arranged in X-Y direction on the semiconductor substrate, each of the memory cells having a first gate electrode formed on a first insulator provided on the semiconductor substrate and a second gate electrode formed on a second insulator provided on the first gate electrode and the capacitance is calculated under an approximation assuming a portion of the semiconductor substrate, at least one of the first and the second insulators and a portion of the second electrode to be one of a conductor and a dielectric depending on electric characteristics thereof, respectively.

14. The semiconductor device designing method according to claim 13, wherein the semiconductor device is a NAND type flash memory.

15. The semiconductor device designing method according to claim 13, wherein the semiconductor device is a NOR type flash memory.

* * * * *